United States Patent
Yun et al.

(10) Patent No.: US 11,825,639 B2
(45) Date of Patent: *Nov. 21, 2023

(54) ELECTRONIC DEVICE COMPRISING INTERPOSER SURROUNDING CIRCUIT ELEMENTS DISPOSED ON PRINTED CIRCUIT BOARD

(71) Applicant: SAMSUNG ELECTRONICS CO., LTD., Suwon-si (KR)

(72) Inventors: Hyelim Yun, Suwon-si (KR); Bongkyu Min, Suwon-si (KR); Dohoon Kim, Suwon-si (KR); Taewoo Kim, Suwon-si (KR); Jinyong Park, Suwon-si (KR); Jungje Bang, Suwon-si (KR); Hyeongju Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/694,529

(22) Filed: Mar. 14, 2022

(65) Prior Publication Data

US 2022/0210957 A1    Jun. 30, 2022

Related U.S. Application Data

(63) Continuation of application No. 16/921,801, filed on Jul. 6, 2020, now Pat. No. 11,277,949, which is a
(Continued)

(30) Foreign Application Priority Data

Sep. 19, 2018   (KR) .................. 10-2018-0112151

(51) Int. Cl.
*H05K 9/00* (2006.01)
*H05K 1/18* (2006.01)
(Continued)

(52) U.S. Cl.
CPC .......... *H05K 9/0032* (2013.01); *H05K 1/115* (2013.01); *H05K 1/144* (2013.01); *H05K 1/181* (2013.01);
(Continued)

(58) Field of Classification Search
CPC ...... H05K 9/0032; H05K 1/115; H05K 1/144; H05K 1/181
(Continued)

(56) References Cited

U.S. PATENT DOCUMENTS 7,341,488 B2   3/2008   Yang et al.
7,570,495 B2   8/2009   Kao
(Continued)

FOREIGN PATENT DOCUMENTS

CN   201878415 U   6/2011
CN   103907404     7/2014
(Continued)

OTHER PUBLICATIONS

International Search Report dated Jan. 20, 2020 in counterpart International Patent Application No. PCT/KR2019/012165.
(Continued)

*Primary Examiner* — Andargie M Aychillhum
(74) *Attorney, Agent, or Firm* — Nixon & Vanderhye, P.C.

(57) ABSTRACT

An example electronic device includes a printed circuit board on which one or more circuit components are disposed, and an interposer surrounding at least some circuit components of the one or more circuit components and including an inner surface adjacent to the at least some circuit components and an outer surface facing away from the inner surface and having a plurality of through holes. The interposer is disposed on the printed circuit board such that one or more through holes of the plurality of through holes
(Continued)

are electrically connected with a ground of the printed circuit board. The outer surface of the interposer includes a first conductive region electrically connected with at least one first through hole of the one or more through holes, and a non-conductive region, the inner surface of the interposer includes a second conductive region electrically connected with at least one second through hole of the one or more through holes, and the second conductive region includes a region facing the non-conductive region.

19 Claims, 11 Drawing Sheets

Related U.S. Application Data continuation of application No. 16/575,679, filed on Sep. 19, 2019, now Pat. No. 10,709,043.

(51) Int. Cl.
H05K 1/11 (2006.01)
H05K 7/14 (2006.01)
H05K 1/14 (2006.01)

(52) U.S. Cl.
CPC . *H05K 7/1427* (2013.01); *H05K 2201/10371* (2013.01); *H05K 2201/10378* (2013.01)

(58) Field of Classification Search
USPC .......................................................... 361/760
See application file for complete search history.

(56) References Cited

U.S. PATENT DOCUMENTS

| | | |
|---|---|---|
| 7,782,629 B2 | 8/2010 | Graydon et al. |
| 8,727,808 B2 | 5/2014 | Mason et al. |
| 8,842,443 B2 | 9/2014 | Lim et al. |
| 9,155,188 B2 | 10/2015 | Merz et al. |
| 9,345,128 B2 | 5/2016 | Regnier |
| 9,462,676 B2 | 10/2016 | Regnier |
| 9,462,732 B2 | 10/2016 | Robinson et al. |
| 9,615,451 B2 | 4/2017 | Katkar et al. |
| 9,671,657 B2 | 6/2017 | Kim et al. |
| 9,761,517 B2 | 9/2017 | Katkar et al. |
| 9,824,979 B2 | 11/2017 | Dimayuga et al. |
| 9,854,678 B2 | 12/2017 | Song et al. |
| 10,021,817 B2 | 7/2018 | Robinson et al. |
| 10,159,148 B2 | 12/2018 | Katkar et al. |
| 10,333,211 B2 | 6/2019 | Kim et al. |
| 10,342,131 B1* | 7/2019 | Kim ...................... H05K 1/115 |
| 10,349,565 B2 | 7/2019 | Mundell et al. |
| 10,419,050 B1 | 9/2019 | Cetinoneri et al. |
| 10,595,407 B2 | 3/2020 | Kim et al. |
| 10,709,043 B2 | 7/2020 | Yun et al. |
| 11,277,949 B2 | 3/2022 | Yun et al. |
| 11,476,569 B2 | 10/2022 | Kim et al. |
| 2005/0260867 A1 | 11/2005 | Ono et al. |
| 2007/0178763 A1 | 8/2007 | Yang et al. |
| 2007/0268679 A1 | 11/2007 | Kao |
| 2008/0202799 A1 | 10/2008 | Graydon et al. |
| 2009/0266603 A1 | 10/2009 | Kao |
| 2012/0243195 A1 | 9/2012 | Lim et al. |
| 2013/0017721 A1 | 1/2013 | Mason et al. |
| 2013/0114228 A1 | 5/2013 | Merz et al. |
| 2014/0048326 A1 | 2/2014 | Lin et al. |
| 2014/0262457 A1 | 9/2014 | Katkar et al. |
| 2014/0262473 A1 | 9/2014 | Robinson et al. |
| 2014/0291818 A1 | 10/2014 | Zhao et al. |
| 2015/0195659 A1 | 7/2015 | Szczech et al. |
| 2015/0241729 A1 | 8/2015 | Kim et al. |
| 2016/0064328 A1* | 3/2016 | Kwon ................. H01L 25/0652 438/109 |
| 2017/0020035 A1 | 1/2017 | Robinson et al. |
| 2017/0048991 A1 | 2/2017 | Kim et al. |
| 2017/0135239 A1 | 5/2017 | Hyun |
| 2017/0164498 A1 | 6/2017 | Song et al. |
| 2017/0186698 A1 | 6/2017 | Dimayuga et al. |
| 2018/0070484 A1 | 3/2018 | Mundell et al. |
| 2019/0082536 A1 | 3/2019 | Park |
| 2020/0163204 A1* | 5/2020 | Kim ..................... H05K 5/0017 |
| 2021/0099560 A1* | 4/2021 | Kim ..................... H04M 1/0277 |

FOREIGN PATENT DOCUMENTS

| | | |
|---|---|---|
| CN | 106852041 | 6/2017 |
| CN | 106935571 | 7/2017 |
| CN | 206962152 U | 2/2018 |
| EP | 2 503 861 | 9/2012 |
| JP | 2017-220654 | 12/2017 |
| KR | 10-2012-0108827 | 10/2012 |
| KR | 10-2019-0119819 | 10/2019 |

OTHER PUBLICATIONS

Yun, et al., U.S. Appl. No. 16/575,679, filed Sep. 19, 2019, now U.S. Pat. No. 10,709,043.
Yun, et al., U.S. Appl. No. 16/921,801, filed Jul. 6, 2020.
Extended Search Report dated Aug. 18, 2021 in EP Application No. 19862455.3.
Office Action dated Mar. 24, 2023 in Korean Patent Application No. 10-2018-0112151 and English-language translation.
Notice of Allowance dated Aug. 10, 2023 in Chinese Patent Application No. 201980061838.2 and English-language machine translation.

* cited by examiner

ELECTRONIC DEVICE COMPRISING INTERPOSER SURROUNDING CIRCUIT ELEMENTS DISPOSED ON PRINTED CIRCUIT BOARD

CROSS-REFERENCE TO RELATED APPLICATIONS

This application is a continuation of U.S. application Ser. No. 16/921,801, filed Jul. 6, 2020, now U.S. Pat. No. 11,277,949, which is a continuation of U.S. application Ser. No. 16/575,679, filed on Sep. 19, 2019, now U.S. Pat. No. 10,709,043, which claims priority to Korean Patent Application 10-2018-0112151, filed on Sep. 19, 2018. The contents of each of these applications are incorporated herein in their entirety.

BACKGROUND

1. Field

The disclosure relates to an electronic device including an interposer that surrounds circuit components disposed on a printed circuit board.

2. Description of Related Art

An electronic device may include a substrate on which a plurality of electronic components are mounted. As the number of functions that are variously supported by an electronic device such as a smartphone gradually increases, a frequency of a clock for an electronic component may become higher, and a data transfer speed may become faster.

An electronic component that operates at a high frequency may cause an electromagnetic interference (EMI). The electronic device may operate abnormally due to the electromagnetic interference. A shield can is disposed in a partial region of the substrate for the purpose of preventing and/or reducing the electromagnetic interference. The shield can is formed of a metal material and may cover the electronic component.

The above information is presented as background information only to assist with an understanding of the disclosure. No determination has been made, and no assertion is made, as to whether any of the above might be applicable as prior art with regard to the disclosure.

A substrate may be miniaturized to make an electronic device smaller. In the case of including the shield can, it is difficult to reduce the area where components are mounted.

SUMMARY

Embodiments of the disclosure address at least the above-mentioned problems and/or disadvantages and provide at least the advantages described below. Accordingly, an example aspect of the disclosure provides an electronic device capable of addressing an electromagnetic interference issue without a shield can and reducing a size of a substrate.

In accordance with an example aspect of the disclosure, an electronic device may include a printed circuit board on which one or more circuit components are disposed, and an interposer surrounding at least some circuit components of the one or more circuit components, the interposer including an inner surface adjacent to the at least some circuit components and an outer surface facing away from the inner surface. A plurality of through holes may be formed in the interposer. The interposer may be disposed on the printed circuit board in a state where one or more through holes of the plurality of through holes are electrically connected with a ground of the printed circuit board. The outer surface of the interposer may include a first conductive region electrically connected with at least one first through hole of the one or more through holes, and a non-conductive region, the inner surface of the interposer may include a second conductive region electrically connected with at least one second through hole of the one or more through holes, and the second conductive region may include a region facing the non-conductive region.

In accordance with another example aspect of the disclosure, an electronic device may include a housing, a first substrate disposed within the housing and including a first signal line and a first ground, a second substrate disposed on the first substrate and including a second signal line and a second ground, and a shielding member comprising a shielding material and surrounding at least a portion of the first substrate and at least a portion of the second substrate to define a shielding space including the at least a portion of the first substrate and the at least a portion of the second substrate. The shielding member may include a first surface connected with the first substrate, a second surface connected with the second substrate, an inner side surface connecting the first surface and the second surface and facing an inner side of the shielding space, an outer side surface connecting the first surface and the second surface and facing an outer side of the shielding space, and conductive vias penetrating the first surface and the second surface disposed along a circumference of the shielding member. The conductive vias may include a plurality of first conductive vias electrically connected with the first signal line and the second signal line, and a plurality of second conductive vias electrically connected with the first ground and the second ground. One of the inner side surface and the outer side surface of the shielding member may include a conductive region electrically connected with the first ground and/or the second ground, and a non-conductive region in the conductive region. The other of the inner side surface and the outer side surface of the shielding member may include a corresponding conductive region facing the non-conductive region, and the corresponding conductive region may be extended to opposite sides of a circumference direction of the shielding member.

In accordance with another example aspect of the disclosure, an interposer may include a substrate including an inner surface and an outer surface facing away from the inner surface, and a plurality of through holes that are formed at the substrate. The outer surface may include a first conductive region electrically connected with at least one first through hole of the plurality of through holes, and a non-conductive region, the inner surface may include a second conductive region electrically connected with at least one second through hole of the plurality of through holes, and the second conductive region may at least include a region facing the non-conductive region.

Other aspects, advantages, and salient features of the disclosure will become apparent to those skilled in the art from the following detailed description, which, taken in conjunction with the annexed drawings, discloses various example embodiments of the disclosure.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Hereinafter, various example embodiments of the disclosure will be described with reference to accompanying drawings. However, those of ordinary skill in the art will recognize that various modifications, equivalents, and/or alternatives of the various example embodiments described herein may be variously made without departing from the scope and spirit of the disclosure.

Figure 1:
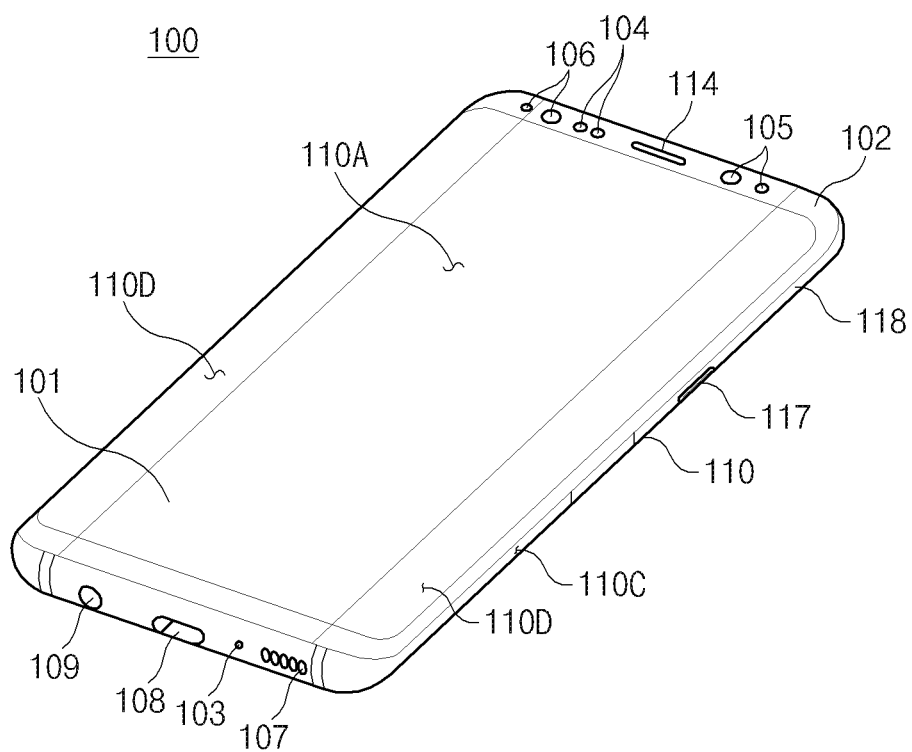
FIG. 1 is a front perspective view illustrating an example electronic device according to an embodiment.
Figure 2:
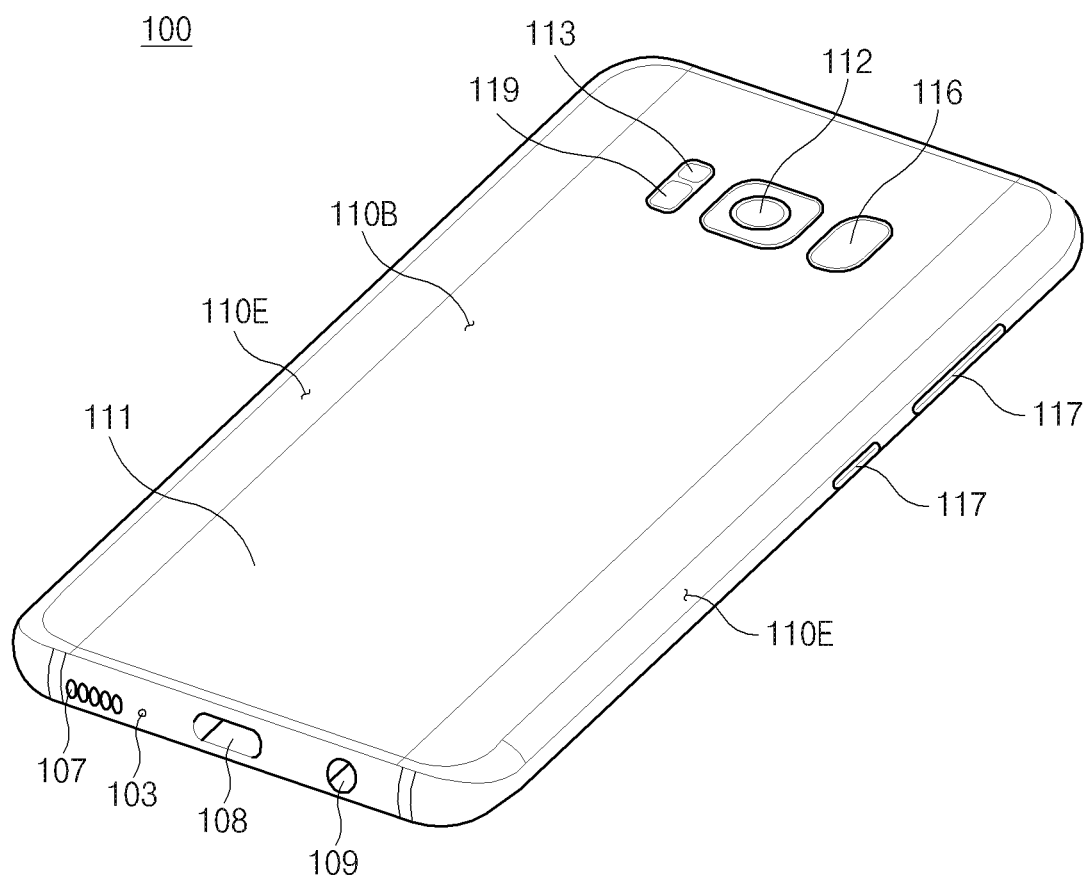
FIG. 2 is a rear perspective view illustrating the example electronic device of FIG. 1 according to an embodiment.

FIG. 1 is a front perspective view illustrating an example electronic device according to an embodiment. FIG. 2 is a rear perspective view illustrating the example electronic device of FIG. 1.

Referring to FIGS. 1 and 2, an electronic device 100 according to an embodiment may include a housing 110 including a first surface (or a front surface) 110A, a second surface (or a back surface) 110B, and a side surface 110C surrounding a space between the first surface 110A and the second surface 110B. In another embodiment (not illustrated), a housing may refer to a structure that forms a part of the first surface 110A, the second surface 110B, and the side surface 110C of FIG. 1. According to an embodiment, the first surface 110A may be implemented with a front plate 102 (e.g., a glass plate including various coating layers, or a polymer plate), at least a portion of which is substantially transparent. The second surface 110B may be implemented with a back plate 111 that is substantially opaque. For example, the back plate 111 may be implemented with a coated or colored glass, a ceramic, a polymer, a metal (e.g., aluminum, stainless steel (STS), or magnesium), or a combination of at least two of the materials. The side surface 110C may be combined with the front plate 102 and the back plate 111 and may be implemented with a side bezel structure (or a "side member") 118 including a metal and/or a polymer. In an embodiment, the back plate 111 and the side bezel structure 118 may be integrally formed and may include the same material (e.g., a metal material such as aluminum).

In the embodiment that is illustrated, the front plate 102 may include two first regions 110D, which are bent toward the back plate 111 from the first surface 110A so as to be seamlessly extended, at opposite long edges of the front plate 102. In embodiment that is illustrated in FIG. 2, the back plate 111 may include two second regions 110E, which are bent toward the front plate 102 from the second surface 110B so as to be seamlessly extended, at opposite long edges of the back plate 111. In an embodiment, the front plate 102 (or the back plate 111) may include only one of the first regions 110D (or the second regions 110E). In another embodiment, a portion of the first regions 110D or the second regions 110E may not be included. In the embodiments, when viewed from the side of the electronic device 100, the side bezel structure 118 may have a first thickness (or width) on one side where the first regions 110D or the second regions 110E are not included, and may have a second thickness on one side where the first regions 110D or the second regions 110E are included. The second thickness may be smaller than the first thickness.

According to an embodiment, the electronic device 100 may include at least one or more of a display 101, an audio module (103, 107, 114), a sensor module (104, 116, 119), a camera module (105, 112, 113), key input devices 117, a light-emitting device 106, and a connector hole (108, 109). In an embodiment, the electronic device 100 may not include at least one (e.g., the key input devices 117 or the light-emitting device 106) of the components or may further include any other component.

The display 101 may be exposed through a considerable portion of the front plate 102, for example. In an embodiment, at least a portion of the display 101 may be exposed through the first surface 110A and the front plate 102 forming the first regions 110D of the side surface 110C. In an embodiment, a corner of the display 101 may be formed to be mostly identical to a shape of an outer portion of the front plate 102 adjacent thereto. In another embodiment (not illustrated), to increase the area where the display 101 is exposed, an interval between an outer portion of the display 101 and an outer portion of the front plate 102 may be formed to be mostly identical.

In another embodiment (not illustrated), a recess or an opening may be defined in a portion of a screen display region of the display 101, and at least one or more of the audio module 114, the sensor module 104, the camera module 105, and the light-emitting device 106 may be provided to be aligned with the recess or the opening. In another embodiment (not illustrated), at least one or more of the audio module 114, the sensor module 104, the camera module 105, the fingerprint sensor 116, and the light-emitting device 106 may be provided on a back surface of the display 101, which corresponds to the screen display region. In another embodiment (not illustrated), the display 101 may be combined with a touch sensing circuit, a pressure sensor capable of measuring the intensity (or pressure) of a touch, and/or a digitizer capable of detecting a magnetic stylus pen or may be disposed adjacent thereto. In an embodiment, at least a part of the sensor module (104, 119) and/or at least a part of the key input devices 117 may be disposed in the first regions 110D and/or the second regions 110E.

The audio module (103, 107, 114) may include a microphone hole 103 and a speaker hole (107, 114). A microphone for obtaining external sound may be disposed within the microphone hole 103; in an embodiment, a plurality of microphones may be disposed to make it possible to detect a direction of sound. The speaker hole (107, 114) may include an external speaker hole 107 and a receiver hole 114 for call. In an embodiment, the speaker hole (107, 114) and the microphone hole 103 may be implemented with one hole, or a speaker (e.g., a piezoelectric speaker) may be included without the speaker hole (107, 114).

The sensor module (104, 116, 119) may generate an electrical signal or a data value corresponding to an internal operation state of the electronic device 100 or corresponding to an external environment state. The sensor module (104, 116, 119) may include, for example, a first sensor module 104 (e.g., a proximity sensor) and/or a second sensor module (not illustrated) (e.g., a fingerprint sensor) disposed on the first surface 110A of the housing 110, and/or a third sensor module 119 (e.g., a hear rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A of the housing 110. The electronic device 100 may further include a sensor module not illustrated, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illumination sensor 104.

The camera module (105, 112, 113) may include a first camera device 105 disposed on the first surface 110A of the electronic device 100, and a second camera device 112 and/or a flash 113 disposed on the second surface 110B. The camera devices 105 and 112 may include one or more lenses, an image sensor, and/or an image signal processor. The flash 113 may include, for example, a light-emitting diode or a xenon lamp. In an embodiment, two or more lenses (e.g., an infrared camera and wide-angle and telephoto lenses) and image sensors may be disposed on one surface of the electronic device 100.

The key input devices 117 may be disposed on the side surface 110C of the housing 110. In another embodiment, the electronic device 100 may not include all or a part of the key input devices 117, and a key input device not included may be implemented on the display 101 in the form of a soft key. In an embodiment, a key input device may include the sensor module 116 disposed on the second surface 110B of the housing 110.

The light-emitting device 106 may be disposed, for example, on the first surface 110A of the housing 110. The light-emitting device 106 may provide status information of the electronic device 100, for example, in the form of light. In another embodiment, the light-emitting device 106 may provide, for example, a light source that operates in conjunction with an operation of the camera module 105. The light-emitting device 106 may include, a light-emitting diode (LED), an IR LED, and a xenon lamp.

The connector hole (108, 109) may include a first connector hole 108 that is capable of accommodating a connector (e.g., a USB connector) for transmitting/receiving a power and/or data to/from an external electronic device, and/or a second connector hole (or an earphone jack) 109 that is capable of accommodating a connector for transmitting/receiving an audio signal to/from the external electronic device.

Figure 3:
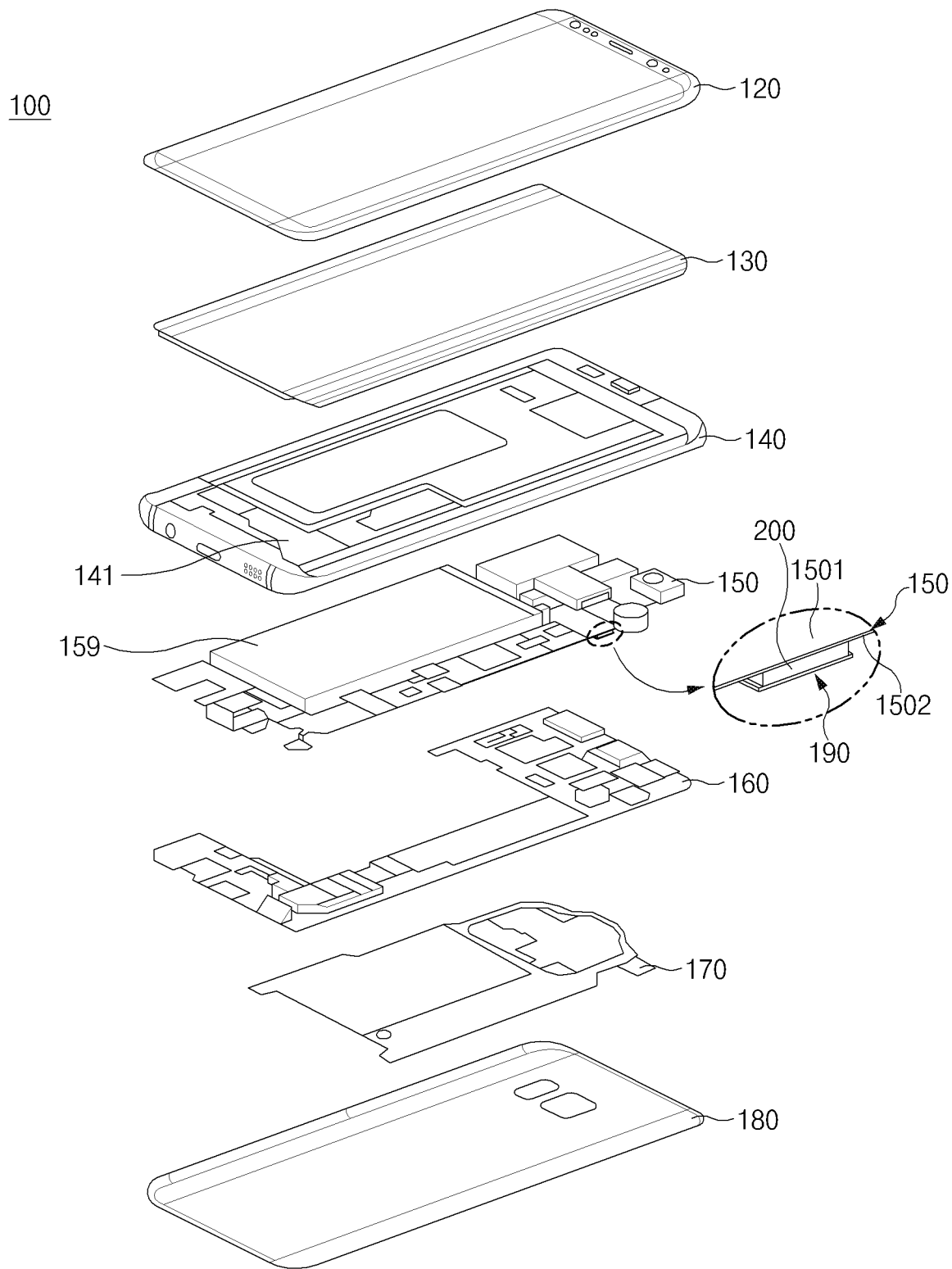
FIG. 3 is an exploded perspective illustrating the example electronic device of FIG. 1 according to an embodiment.

FIG. 3 is an exploded perspective view illustrating the example electronic device of FIG. 1 according to an embodiment.

Referring to FIG. 3, the electronic device 100 may include a side bezel structure 140 (e.g., a side member), a first support member 141 (e.g., a bracket), a front plate 120, a display 130, a printed circuit board 150, a battery 159, a second support member 160 (e.g., a rear case), an antenna 170, and a back plate 180. In any example embodiment, the electronic device 100 may not include at least one (e.g., the first support member 141 or the second support member 160) of the components or may further include any other component. At least one of the components of the electronic device 100 may be identical or similar to at least one of the components of the electronic device 100 of FIG. 1 or 2, and thus, additional description may not be repeated here.

The first support member 141 may be disposed within the electronic device 100, and the first support member 141 may be connected with the side bezel structure 140 or may be integrally formed with the side bezel structure 140. The first support member 141 may be formed of, for example, a metal material and/or a nonmetal material (e.g., a polymer). The display 130 may be coupled with one surface of the first support member 141, and the printed circuit board 150 may be coupled with an opposite surface of the first support member 141. A processor, a memory, and/or an interface may be mounted on the printed circuit board 150. For example, the processor may include one or more of a central processing unit, an application processor, a graphic processing device, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, a secure digital (SD) card interface, and/or an audio interface. The interface may electrically or physically connect, for example, the electronic device 100 with an external electronic device and may include a USB connector, an SD card/MMC connector, or an audio connector.

The battery 159 that is a device for supplying a power to at least one component of the electronic device 100 may include, for example, a primary cell incapable of being recharged, a secondary cell rechargeable, or a fuel cell. At least a portion of the battery 159 may be disposed on substantially the same plane as the printed circuit board 150, for example. The battery 159 may be integrally disposed within the electronic device 100, or may be disposed to be removable from the electronic device 100.

The antenna 170 may be interposed between the back plate 180 and the battery 159. The antenna 170 may include, for example, a near field communication (NFC) antenna, an antenna for wireless charging, and/or a magnetic secure transmission (MST) antenna. For example, the antenna 170 may perform short range communication with an external device or may wirelessly transmit/receive a power necessary to charge. In another embodiment, an antenna structure may be implemented with a portion of the side bezel structure 140 and/or the first support member 141, or with a combination thereof.

Figure 4:
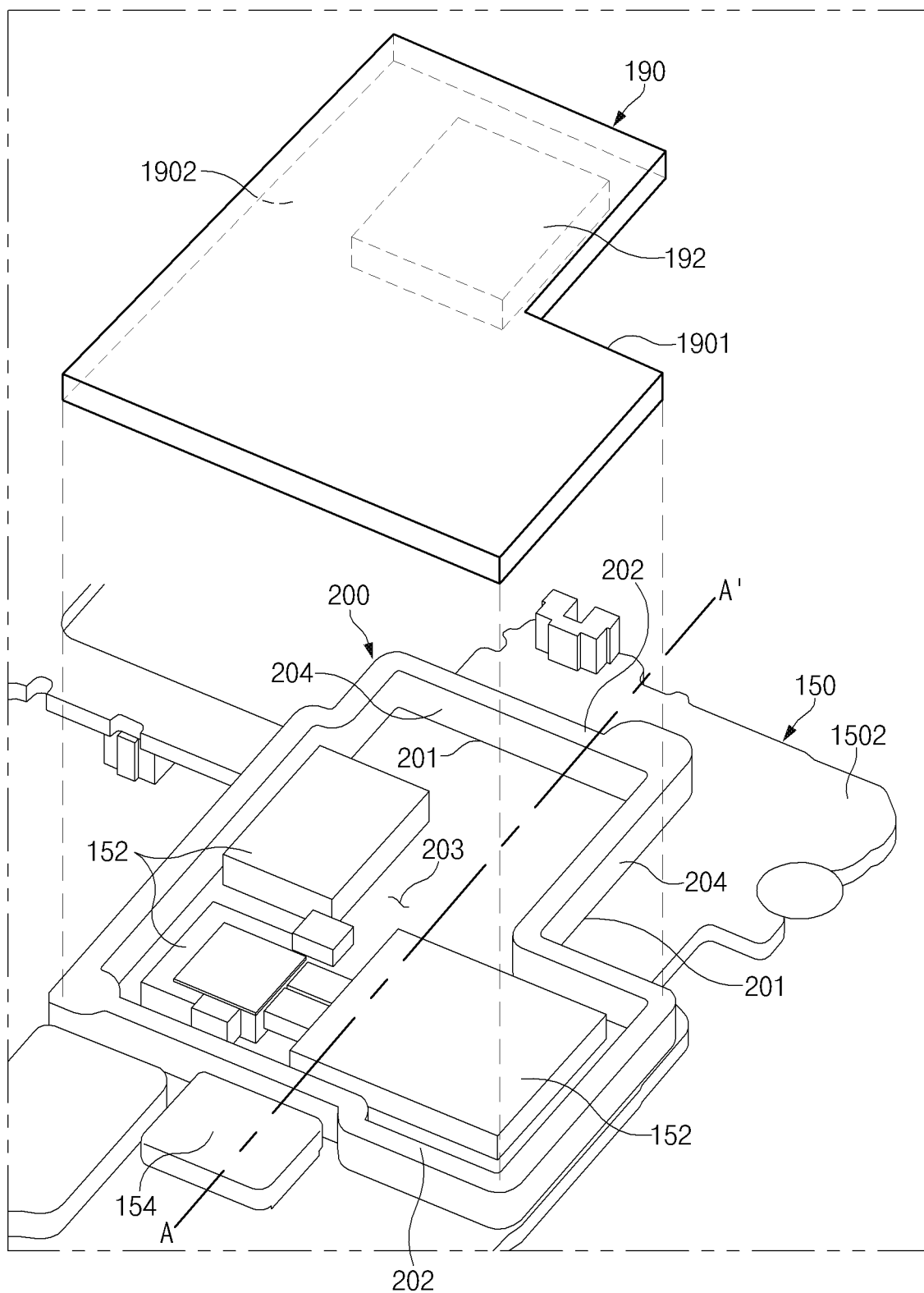
FIG. 4 is an exploded perspective view illustrating an example first substrate and an example second substrate of an example electronic device according to various embodiments.

Referring to FIG. 4, the electronic device 100 may further include an interposer 200 (e.g., a shielding member) defining a shielding space 203 between a first substrate 150 (e.g., the printed circuit board 150 of FIG. 3) and a second substrate 190. The interposer 200 may, for example, and without limitation, be implemented with a polygon-shaped ring member.

In an embodiment, the first substrate 150 (e.g., the printed circuit board 150 of FIG. 3) may include one or more electrical components (e.g., a second electrical component 154), a wire electrically connecting the electrical components, and a ground.

In various embodiments, the second substrate 190 may be disposed on a first surface 1501 of the first substrate 150 or a second surface 1502 of the first substrate 150, which faces away from the first surface 1501, depending on a kind and/or function of an electrical component 192 mounted on the second substrate 190.

In various embodiments, the interposer 200 may be disposed between the first substrate 150 and the second substrate 190 so as to surround the shielding space 203 between the first substrate 150 and the second substrate 190. For example, as illustrated in FIG. 3, the second substrate 190 may be disposed to face the back plate 180 (e.g., to face a back surface of an electronic device), and the interposer 200 may be disposed on the second surface 1502 of the first substrate 150 to face a back plate (e.g., the back plate 180 of FIG. 3).

In an embodiment, the second substrate 190 may be interposed between the first substrate 150 and the back plate 180. In other words, the second substrate 190 may be disposed on a second surface (not illustrated) of the first substrate 150, which faces the back plate 180. For example, the second substrate 190 may be an antenna substrate from which an RF signal is radiated. Alternatively, the electrical component 192 included in the second substrate 190 may include a communication module. The second substrate 190 may be interposed between the first substrate 150 and the back plate 180 such that an RF signal radiated from the second substrate 190 is transmitted through the back plate 180.

In an embodiment, the second substrate 190 may be interposed between the first substrate 150 and the first support member 141 (e.g., a bracket included in the side member 140 of FIG. 3). The second substrate 190 may include one or more electrical components, a wire electrically connecting the electrical components, and a ground.

In an embodiment, electrical components mounted on the first substrate 150 and the second substrate 190 may include an active component and a passive component. The first substrate 150 and the second substrate 190 may be disposed such that a given space (e.g., the shielding space 203 of FIG. 4) is formed therebetween. At least a portion of the second substrate 190 may face at least a portion of the first substrate 150.

In an embodiment, the interposer 200 may include a first surface 201, a second surface 202 facing away from the first surface 201, and a side surface 204 connecting the first surface 201 and the second surface 202. The first surface 201 of the interposer 200 may be disposed on the first substrate 150, and the second surface 202 thereof may be disposed on the second substrate 190.

The interposer 200 may be disposed on the first surface (e.g., the first surface 1501 of the first substrate 150 of FIG. 3) or the second surface 1502 of the first substrate 150. For example, in the case where the second substrate 190 faces the back plate 180, the interposer 200 may be disposed on the second surface 1502 of the first substrate 150 as illustrated in FIG. 4. Alternatively, in the case where the second substrate 190 faces the front plate 120, the interposer 200 may be disposed on the first surface (e.g., the first surface 1501 of the first substrate 150 of FIG. 3) of the first substrate 150. The interposer 200 may be disposed to surround at least a partial region of the first substrate 150. The interposer 200 may form the shielding space 203 therein, and at least one electrical component may be disposed on the first substrate 150 included in the shielding space 203. Referring to FIG. 4, a first electrical component 152 may be disposed on the first substrate 150 corresponding to the interior of the shielding space 203, and the second electrical component 154 may be disposed on the first substrate 150 corresponding to the outside of the shielding space 203.

The second substrate 190 may include a first surface 1901 facing an outer side of the shielding space 203 and a second surface 1902 facing an inner side of the shielding space 203. At least a partial region of the second surface 1902 of the second substrate 190 may be surrounded by the interposer 200. A third electrical component 192 may be disposed on the second substrate 190 corresponding to the interior of the shielding space 203. As such, in the electronic device 100 according to an embodiment, as some components are disposed on the second substrate 190, an inner space of the electronic device 100 may be efficiently utilized.

Referring to FIG. 4, the second substrate 190 may be formed with various sizes. For example, the second substrate 190 may be formed with the same size as the first substrate 150, or the second substrate 190 may be formed to be smaller than the first substrate 150 or may be formed to be larger than the first substrate 150. The second substrate 190 may be formed in a shape corresponding to the shape of the interposer 200. The shapes of the first substrate 150 and the second substrate 190 illustrated in drawings are an example, and each substrate may be formed in various shapes.

Figure 5:
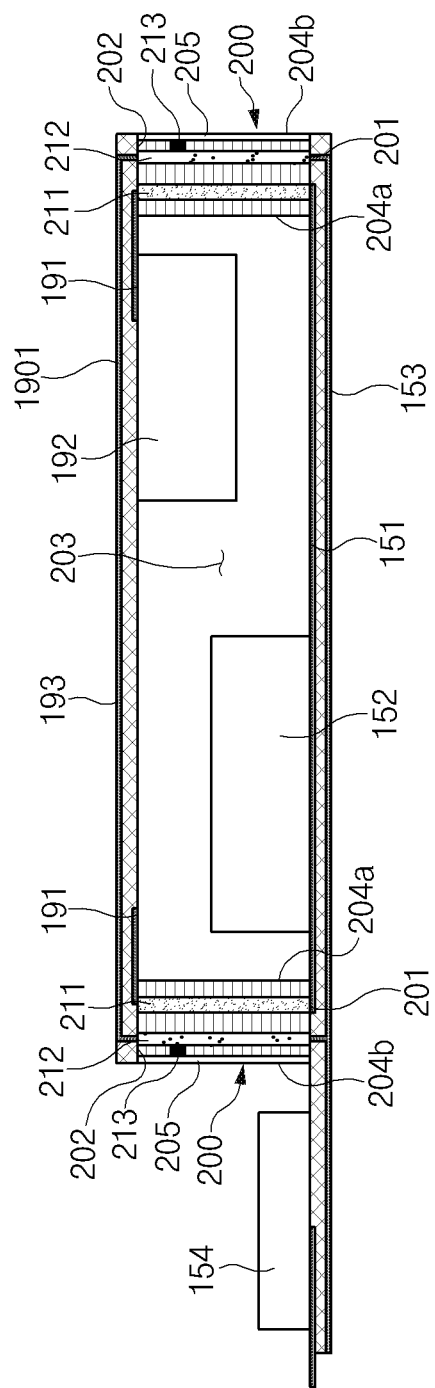
FIG. 5 is a cross-sectional view illustrating an example electronic device according to an embodiment.

FIG. 5 is a cross-sectional view illustrating the example electronic device 100 according to an embodiment. FIG. 5 is a view illustrating a cross section taken along a line A-A' of FIG. 4.

In an embodiment, the electronic device 100 may include the first substrate 150, the second substrate 190, and the interposer 200 disposed between the first substrate 150 and the second substrate 190 and connecting the first substrate 150 and the second substrate 190. The first substrate 150 may include a first signal line 151, a first ground 153, the first electrical component 152 disposed within the shielding space 203, and the second electrical component 154 disposed outside the shielding space 203. The second substrate 190 may include a second signal line 191, a second ground 193, and the third electrical component 192.

In the embodiment illustrated in FIG. 5, an antenna pattern may be formed on the first surface 1901 (e.g., an upper surface in FIG. 5) of the second substrate 190. In this case, the first surface 1901 of the second substrate 190 may be a surface facing a back plate (e.g., the back plate 180 of FIG. 3).

For example, the second substrate 190 may include a printed circuit board, and the antenna pattern may be formed on the second substrate 190. For example, the antenna pattern may include a laser direct structuring (LDS) antenna formed by plating a conductive material on a pattern formed by the laser. The antenna pattern may function as a patch antenna or a dipole antenna.

In an embodiment, the interposer 200 may have an insulating characteristic. The shielding space 203 may be formed between the first substrate 150, the second substrate 190, and the interposer 200. One or more electrical components may be disposed in the shielding space 203. For example, the one or more electrical components disposed in the shielding space 203 may include the first electrical component 152 mounted on the first substrate 150 and the third electrical component 192 disposed on the second substrate 190.

In an embodiment, the interposer 200 may include the first surface 201 disposed on the first substrate 150, the second surface 202 disposed on the second substrate 190, and the side surface 204 formed between the first surface 201 and the second surface 202. The side surface 204 may include an inner side surface 204a facing an inner side of the shielding space 203 and an outer side surface 204b facing an outer side of the shielding space 203.

In an embodiment, the interposer 200 may include a conductive via(s) formed to penetrate the second surface 202 from the first surface 201. The conductive vias may include a first conductive via(s) 211 electrically connecting the first signal line 151 of the first substrate 150 and the second signal line 191 of the second substrate 190, a second conductive via(s) 212 electrically connecting the first ground 153 of the first substrate 150 and the second ground 193 of the second substrate 190, and a third conductive via(s) 213 electrically connecting the second conductive via 212 and a conductive region 205.

In an embodiment, the interposer 200 may be comprised of an insulating material. The side surface 204 of the interposer 200 may include a plating region (e.g., the conductive region 205) and a non-plating region (e.g., a non-conductive region 206 (see, e.g., FIG. 6)). In this case, the plating region may be formed by plating a side surface of the interposer 200. The non-plating region may be a region that is not plated.

Referring to FIG. 5, the first conductive via 211 and the second conductive via 212 may be formed to penetrate the first surface 201 and the second surface 202 of the interposer 200, and the third conductive via 213 may be formed to be perpendicular to the first conductive via 211 or the second conductive via 212.

In an embodiment, the interposer 200 may include the conductive region 205 formed at at least a portion of the outer side surface 204b. The conductive region 205 may be electrically connected with the second conductive via 212 by the third conductive via 213. As such, the conductive region 205 may be implemented with a conductive region that is electrically connected with a ground of the first substrate 150 and a ground of the second substrate 190.

In an embodiment, the interposer 200 may include the conductive region 205 formed at at least a portion of the inner side surface 204a. The conductive region 205 may be electrically connected with the second conductive via 212 by the third conductive via 213. As such, the conductive region 205 may be implemented with a conductive region that is electrically connected with the ground of the first substrate 150 and the ground of the second substrate 190.

In various embodiments, each of the first ground 153 of the first substrate 150 and the second ground 193 of the second substrate 190 may, for example, be formed at the outermost layer of the corresponding substrate or may form the outermost layer of the corresponding substrate. The second conductive via 212 connected with the first ground 153 and the second ground 193 may be formed to be more distant from the inner side surface 204a than the first conductive via 211. The conductive region 205 connected with the ground may be formed on the outer side surface 204b of the interposer 200. As such, an electromagnetic noise that is emitted from an electrical component and/or a signal line disposed within the shielding space 203 may be prevented from being emitted to the outside of the shielding space 203, and/or the emission of the electromagnetic noise may be decreased.

In an embodiment, the interposer 200 may include a plurality of substrates stacked. The interposer 200 may include an opening portion formed at central portions of the plurality of stacked substrates and a surrounding portion (e.g., including the first surface 201, the second surface 202, and the side surface 204 of FIG. 4) surrounding the opening portion (e.g., the shielding space 203 of FIG. 5).

In an embodiment, the interposer 200 may include a plurality of through holes (e.g., the conductive vias 211 and 212 of FIG. 5) penetrating the plurality of substrates. The plurality of through holes may be filled with a conductive material. A ground region may be formed at at least one of the plurality of substrates. A part (e.g., the second conductive via 212 of FIG. 4) of the plurality of through holes may be connected with the ground region by the conductive material filled in the through hole(s).

Figure 6:
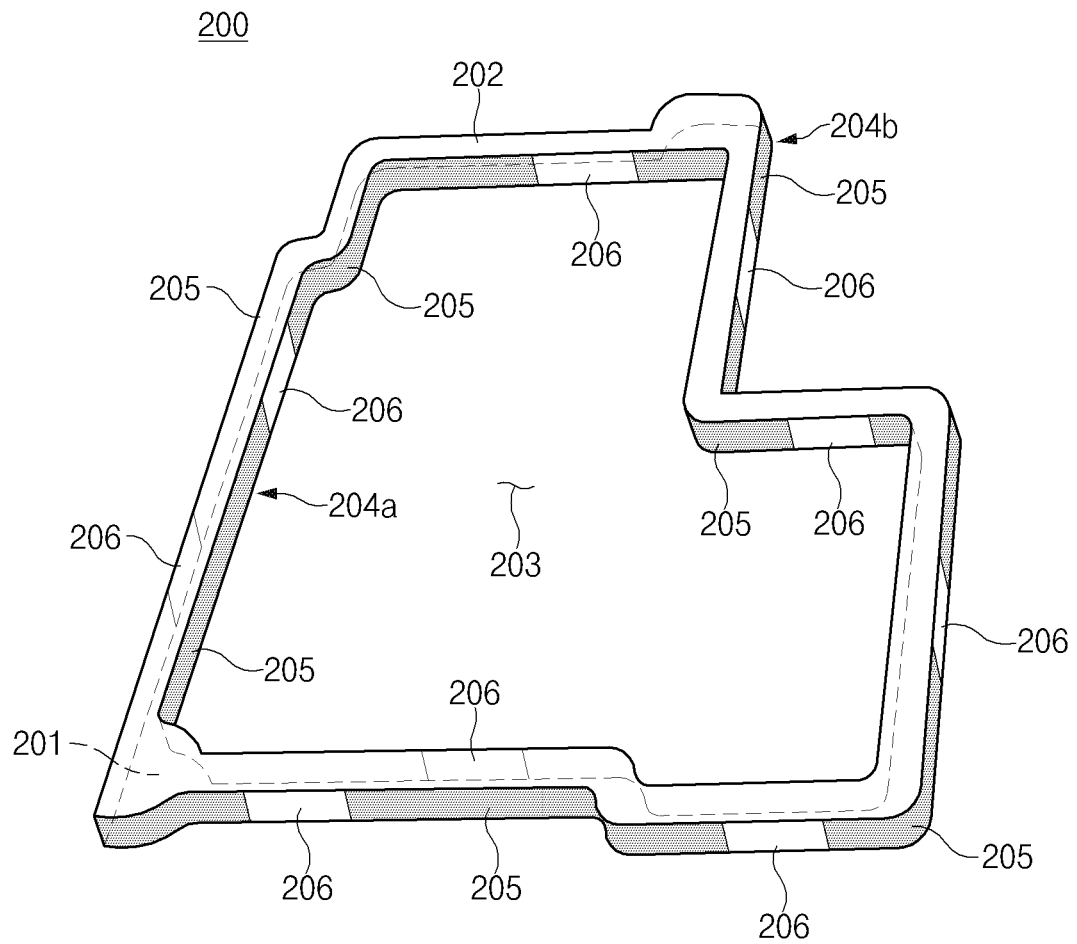
FIG. 6 is a diagram illustrating an example interposer of an example electronic device with a conductive via not illustrated according to an embodiment.
Figure 7:
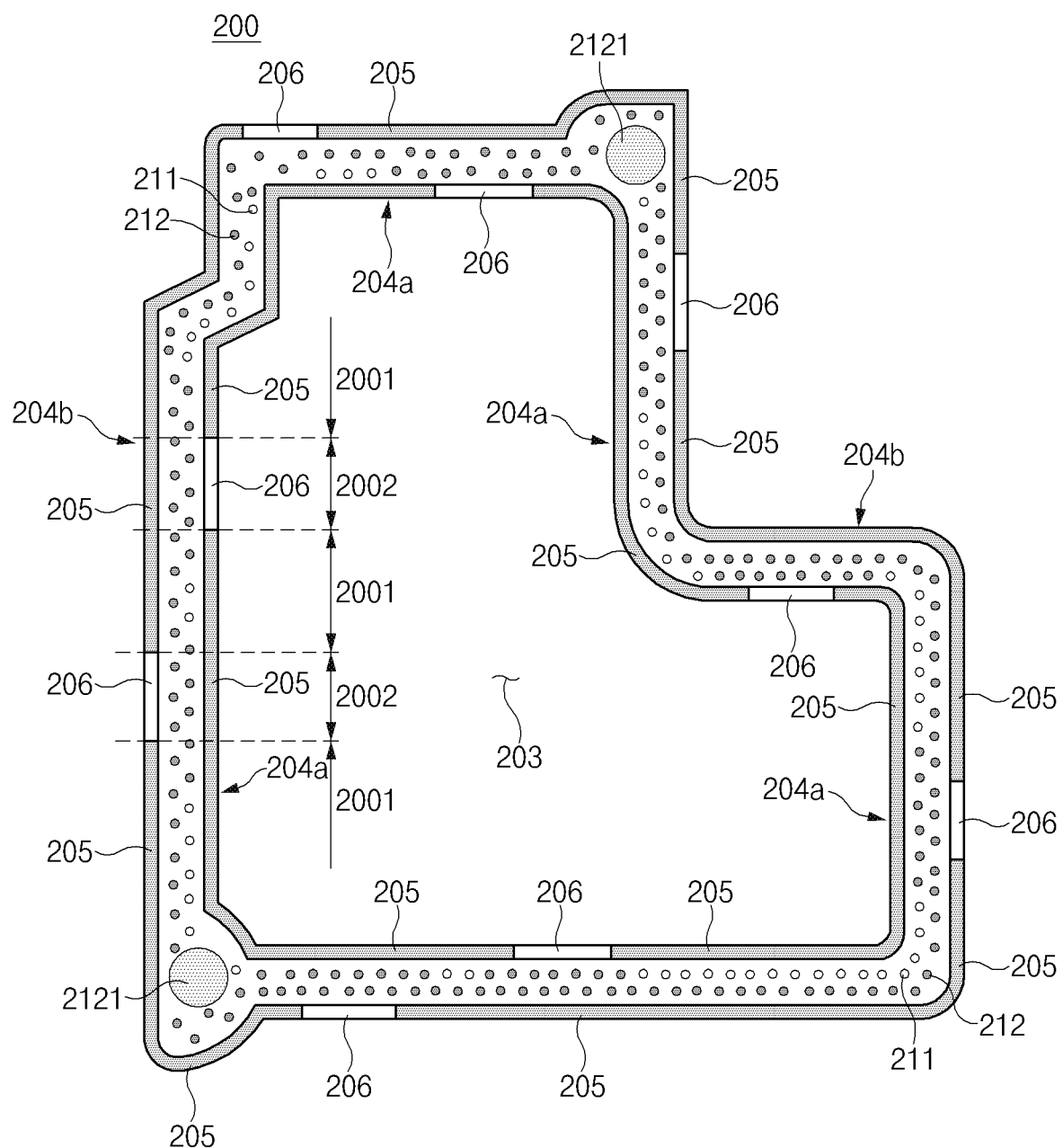
FIG. 7 is a diagram illustrating an example first surface and an example side surface of an example interposer of an example electronic device according to an embodiment.

FIG. 6 is a diagram illustrating the example interposer 200 of the example electronic device 100 according to an embodiment, with a conductive via not illustrated. FIG. 7 is a diagram illustrating the first surface 201 and the side surface 204 of the example interposer of the example electronic device 100 according to an embodiment.

Referring to FIG. 6, the interposer 200 may include the first surface 201 facing downwards on a drawing, the second surface 202 facing upwards on a drawing, and the side surface 204 surrounding a space between the first surface 201 and the second surface 202. The interposer 200 may, for example, and without limitation, be formed in the shape of a polygonal ring in which the shielding space 203 is defined. The side surface 204 of the interposer 200 may include the inner side surface 204a facing the shielding space 203 and the outer side surface 204b facing an outer side of the shielding space 203. A direction in which the interposer 200 is extended may be referred to, for example, as a "circumference direction of the interposer 200".

According to an embodiment, the inner side surface 204a and the outer side surface 204b may include the conductive regions 205 (e.g., plating regions), and the non-conductive regions 206 (e.g., non-plating regions) formed between the conductive regions 205. As described above, the conductive region 205 may be implemented with a conductive region that is electrically connected with the first ground 153 of the first substrate 150 and the second ground 193 of the second substrate 190.

Referring to FIG. 6, a region that faces any one non-conductive region 206 may be formed of the conductive region 205. That is, the non-conductive region 206 formed on the inner side surface 204a and the non-conductive region 206 formed on the outer side surface 204b may be disposed not to face each other. The non-conductive region 206 formed on the inner side surface 204a and the non-conductive region 206 formed on the outer side surface 204b may be disposed to be spaced from each other as much as a given interval in the circumference direction of the interposer 200. The non-conductive region 206 formed on the inner side surface 204a and the non-conductive region 206 formed on the outer side surface 204b may be disposed in a zig-zag shape. This is for effectively blocking an electromagnetic noise occurring from the interior of the shielding space 203, and the conductive region 205 may be formed on at least one of the inner side surface 204a and the outer side surface 204b that are placed on a path where the noise is emitted.

Referring to FIG. 7, the interposer 200 may include the first conductive via(s) 211 and the second conductive via(s) 212. As described above, the first conductive via 211 may be electrically connected with signal lines included in the first substrate 150 and the second substrate 190, and the second conductive via 212 may be electrically connected with grounds included in the first substrate 150 and the second substrate 190.

According to an embodiment, conductive vias of the interposer 200 may be arranged substantially along the circumference direction of the interposer 200. The conductive vias may be disposed to form at least four columns at the first surface 201 of the interposer 200. Each of outermost conductive vias of the conductive vias disposed to form at least four columns may be the second conductive via 212 connected with the ground. A part of the second conductive vias 212 may be formed to be closer to the shielding space 203 (or the inner side surface 204a) than the outermost conductive vias. Referring to FIG. 7, most of the second conductive vias 212 may form the outermost column of the columns that the conductive vias form, and the remaining conductive vias may form a column closer to the shielding space 203 (or the inner side surface 204a) than the outermost column. Meanwhile, the first conductive via 211 may be formed to be closer to the shielding space 203 (or the inner side surface 204a) than the second conductive via 212 corresponding to the outermost conductive via.

In an embodiment, the interposer 200 may include a first portion(s) 2001 where opposite side surfaces 204 are formed of the conductive region 205, and a second portion(s) 2002 where one side surface 204 is formed of the non-conductive region 206 and the other side surface 204 is formed of the conductive region 205. Referring to FIG. 7, the first portions 2001 may be disposed on opposite sides of the circumference direction of the interposer 200 with respect to the second portion 2002.

In various embodiments, conductive vias included in the second portion 2002 may include the second conductive vias 212. In an embodiment, all the conductive vias included in the second portion 2002 may be implemented with the second conductive via 212. In other words, because one side surface 204 of the second portion 2002 is formed of the non-conductive region 206 where the performance of shielding is relatively low, an electromagnetic noise that is emitted through the non-conductive region 206 may be effectively shielded by implementing all the conductive vias included in the second portion 2002 with the second conductive via 212.

In various embodiments, conductive vias included in the first portion 2001 may include the first conductive vias 211. In an embodiment, a part of the conductive vias included in the first portion 2001 may be implemented with the first conductive via 211. Because opposite side surfaces 204 of the first portion 2001 are formed of the conductive region 205 where the performance of shielding is relatively high, even though the first conductive vias 211 for transmitting/receiving an electrical signal are included in the first portion 2001, the performance of electromagnetic shielding may not be considerably affected.

Referring to FIG. 7, because the first portions 2001 are connected with opposite sides of the second portion 2002, the conductive region 205 facing the non-conductive region 206 may be formed to be wider than the non-conductive region 206.

In various embodiments, the second conductive vias 212 may further include a (2-1)-th conductive via(s) 2121 that is formed to be relatively large. The (2-1)-th conductive via 2121 may, for example, be formed at a corner portion of the interposer 200 as illustrated in FIG. 7. The amount of conductive material filled in the (2-1)-th conductive via 2121 may be greater than the amount of conductive material filled in the second conductive via 212. The (2-1)-th conductive via 2121 may increase the contact area of the conductive material between the interposer 200 and a first substrate (e.g., the first substrate 150 of FIG. 4), thus making it possible to combine the first substrate 150 and the interposer 200 stably. Likewise, the (2-1)-th conductive via 2121 may increase the contact area of the conductive material between the interposer 200 and a second substrate (e.g., the second substrate 190 of FIG. 4), thus making it possible to combine the second substrate 190 and the interposer 200 stably. As a result, the (2-1)-th conductive via 2121 may be connected with a ground region to form the shielding space 203, and may also increase an adhesive force between the first substrate 150 and the second substrate 190.

Figure 8:
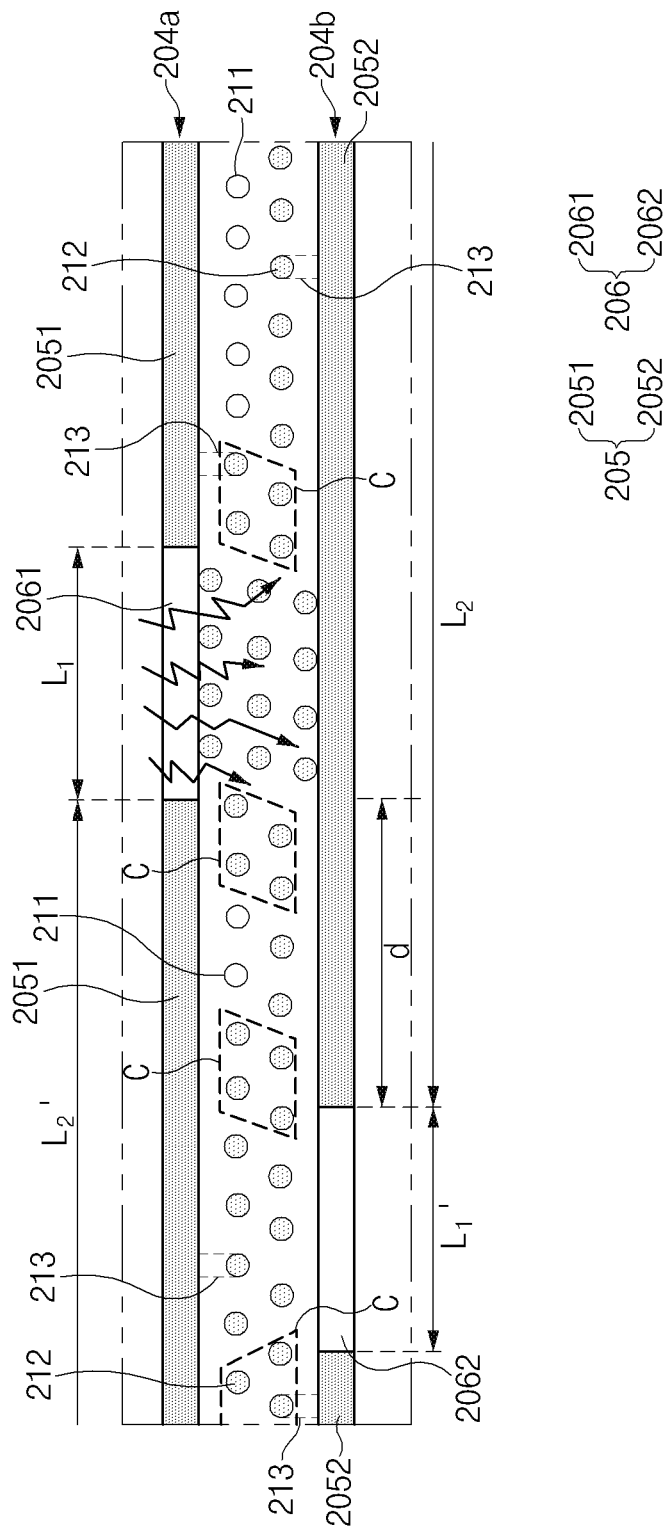
FIG. 8 is a diagram illustrating a portion of an example interposer of an example electronic device according to an embodiment.

FIG. 8 is a diagram illustrating a portion of the example interposer 200 of the electronic device 100 according to an embodiment.

Referring to FIG. 8, conductive vias may be formed at the first surface 201 of the interposer 200, and each of the inner side surface 204a and the outer side surface 204b may include the non-conductive region 206 between the conductive regions 205.

The inner side surface 204a shown above on a drawing may include first conductive regions 2051 and a first non-conductive region 2061 formed between the first conductive regions 2051. Here, each of the first conductive regions 2051 may be a conductive region electrically connected with at least a part of the second conductive vias 212. The first conductive region 2051 may be connected with the ground through the second conductive via 212.

In an embodiment, the first conductive regions 2051 may be formed on opposite sides of the first non-conductive region 2061, and the first non-conductive region 2061 may face a second conductive region 2052. An electromagnetic noise occurring from the shielding space 203 may be radiated along a path that starts from the interior of the shielding space 203 (e.g., a space above the inner side surface 204a in FIG. 8), passes through the interposer 200, and faces the outside of the shielding space 203 (e.g., a space below the outer side surface 204b in FIG. 8). The path may be formed to pass through at least one conductive region 205. As such, the electromagnetic noise occurring from the shielding space 203 may be shielded by at least one conductive region 205 and the second conductive vias 212 connected with the ground.

For example, a noise passing through the first non-conductive region 2061 may be shielded by the second conductive vias 212 and the second conductive region 2052 electrically connected with the second conductive vias 212 grounded.

In various embodiments, the second conductive regions 2052 facing the first non-conductive region 2061 may be formed to be wider than the first non-conductive region 2061. For example, when a height of the interposer 200 is uniform along the circumference direction, widths of the first non-conductive region 2061 and the second conductive region 2052 may be proportional to lengths illustrated in FIG. 8. Referring to FIG. 8, a length $L_2$ of the second conductive region 2052 may be longer than a length $L_1$ of the first non-conductive region 2061.

The outer side surface 204b shown below on a drawing may include the second conductive regions 2052 and a second non-conductive region 2062 formed between the second conductive regions 2052. Here, each of the second conductive regions 2052 may be a conductive region electrically connected with at least a part of the second conductive vias 212. The second conductive region 2052 may be connected with the ground through the second conductive via 212.

In an embodiment, the second conductive regions 2052 may be formed on opposite sides of the second non-conductive region 2062, and the second non-conductive region 2062 may face the first conductive region 2051. An electromagnetic noise occurring from the shielding space 203 may be radiated along a path that starts from the interior of the shielding space 203 (e.g., a space above the inner side surface 204a in FIG. 8), passes through the interposer 200, and faces the outside of the shielding space 203 (e.g., a space below the outer side surface 204b in FIG. 8). The path may be formed to pass through at least one conductive region 205. As such, the electromagnetic noise occurring from the shielding space 203 may be shielded by at least one conductive region 205 and the second conductive vias 212 connected with the ground.

In various embodiments, the first conductive region 2051 facing the second non-conductive region 2062 may be formed to be wider than the second non-conductive region 2062. For example, when a height of the interposer 200 is uniform along the circumference direction, widths of the second non-conductive region 2062 and the first conductive region 2051 may be proportional to lengths illustrated in FIG. 8. Referring to FIG. 8, a length $L_2'$ of the first conductive region 2051 may be longer than a length $L_1'$ of the second non-conductive region 2062.

Referring to FIG. 8, the first non-conductive region 2061 and the second non-conductive region 2062 may be spaced as much as a given interval "d". In this case, the given interval "d" may be a length in the circumference direction of the interposer 200. As the interval increases, an electromagnetic noise may be prevented from being radiated to the outside of the shielding space 203 through both the first non-conductive region 2061 and the second non-conductive region 2062.

In an embodiment, the width of the second conductive region 2052 may be two times the width of the first non-conductive region 2061 that the second conductive region 2052 faces. Referring to FIG. 8, when the interposer 200 has a uniform height, $L_2=2L_1$. In this case, the second conductive region 2052 may include a correspondence region corresponding to the first non-conductive region 2061 and extension regions extended to opposite sides of the correspondence region. The correspondence region may be a region having the same width as the first non-conductive region 2061. In various embodiments, the width of each of a first extension region extended to one side of the correspondence region and a second extension region may be approximately ½ times the width of the first non-conductive region 2061. In this case, the width of the second conductive region 2052 may be at least two times the width of the first non-conductive region 2061.

Referring to FIG. 8, conductive vias formed between the conductive regions 205 from among conductive vias may include the first conductive via 211 through which an electrical signal flows. Meanwhile, conductive vias formed between the conductive region 205 and the non-conductive region 206 from among the conductive vias may include the second conductive via 212 connected with the ground.

In an embodiment, in conductive vias formed between the conductive region 205 and the non-conductive region 206, the number of second conductive vias 212 may be more than the number of first conductive vias 211. For example, the density of the second conductive vias 212 in the region between the non-conductive region 206 and the conductive region 205 may be higher than in any other region. In detail, a pitch interval between the second conductive vias 212 formed in a region between the non-conductive region 206 and the conductive region 205 may be smaller than in any other region, or the size of the second conductive via 212 formed in a region between the non-conductive region 206 and the conductive region 205 may be larger than in any other region.

For example, referring to region "C", only the second conductive vias 212 may be formed in the vicinity of the non-conductive region 206, and thus, a noise may be prevented from being radiated from the non-conductive region 206 or from being introduced into the non-conductive region 206.

Figure 9A:
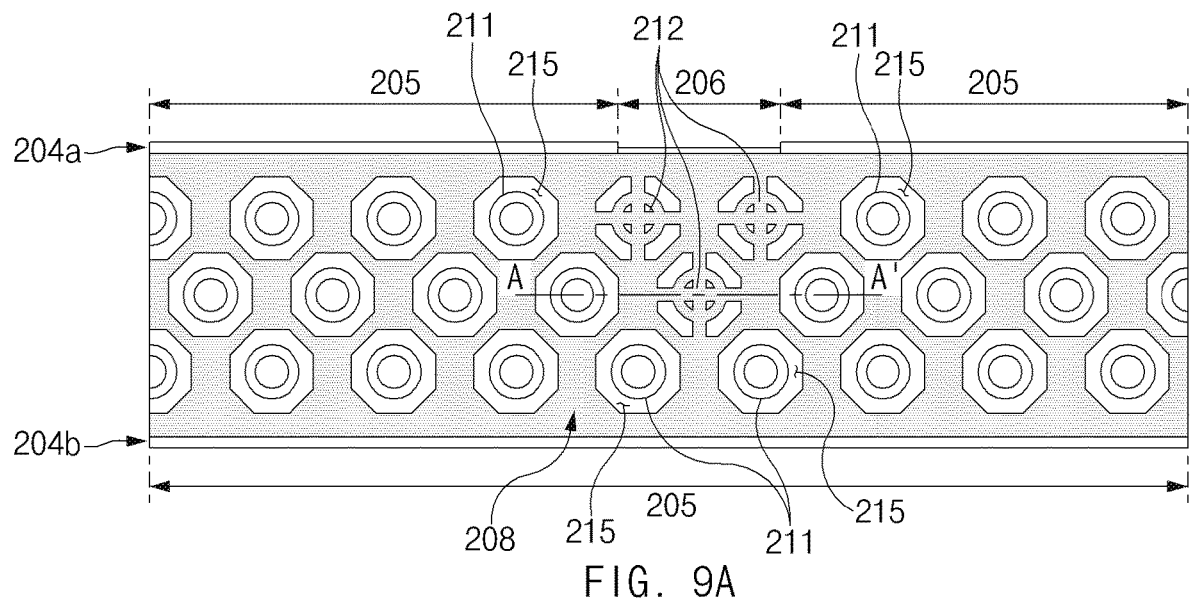
FIGS. 9A and 9B are diagrams illustrating an example interposer of an example electronic device according to various embodiments.
Figure 9B:
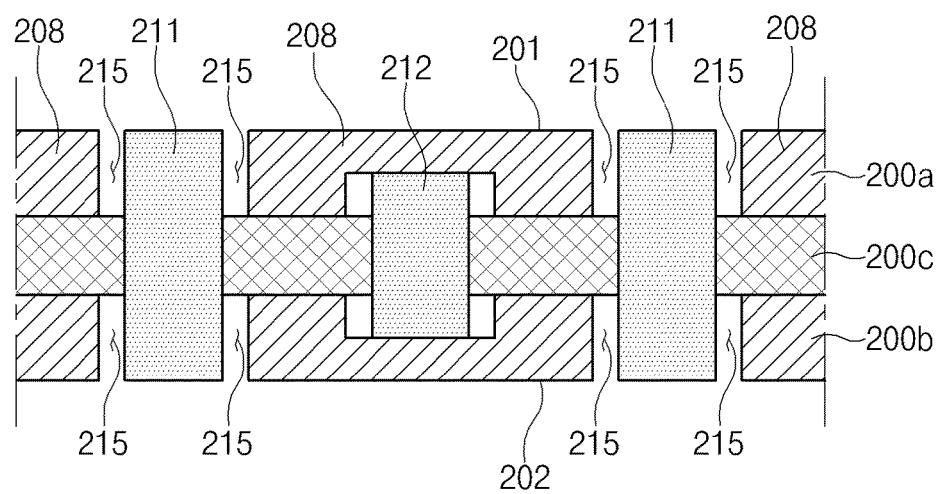

FIGS. 9A and 9B are diagrams illustrating an example interposer of an electronic device according to various embodiments.

In an embodiment illustrated, an interposer may include a first surface, a second surface, an inner side surface, and an outer side surface.

In the embodiment illustrated, the inner side surface 204a and the outer side surface 204b may include the conductive regions 205 (e.g., plating regions), and the non-conductive regions 206 (e.g., non-plating regions) formed between the conductive regions 205. As described above, the conductive region 205 may be formed of a conductive region that is electrically connected with the first ground 153 of the first substrate 150 and the second ground 193 of the second substrate 190.

In the embodiment illustrated, the first surface 201 and the second surface 202 may include a conductive plate 208. The conductive plate 208 may be electrically connected with the conductive regions 205 formed on the inner side surface 204a and the outer side surface 204b. The non-conductive region 206 formed on the inner side surface 204a may be implemented with the conductive region 205 formed on the outer side surface 204b.

In the embodiment illustrated, the interposer 200 may include the first conductive via 211 and the second conductive via 212. As described above, the first conductive via 211 may be electrically connected with signal lines included in the first substrate 150 and the second substrate 190, and the second conductive via 212 may be electrically connected with ground regions included in the first substrate 150 and the second substrate 190.

In the embodiment illustrated, each of the first conductive via 211 and the second conductive via 212 may be surrounded by the conductive plate 208. In this case, the second conductive via 212 may be electrically connected with the conductive plate 208. Accordingly, a ground signal may be applied to the second conductive via 212. An opening 215 surrounding the first conductive via 211 may be formed between the first conductive via 211 and the conductive plate 208. As such, the first conductive via 211 may be electrically insulated from the conductive plate 208.

In various embodiments, because the first conductive via 211 is surrounded by the conductive plate 208 formed in the ground region, an electrical signal flowing through the first conductive via 211 or a noise coming from the electrical signal may be shielded. That is, an electrical signal flowing through one first conductive via 211 may not have an influence on (or of) an electrical signal flowing through another first conductive via 211.

In the embodiment illustrated, the conductive via 212 may be formed adjacent to the non-conductive region 206.

Referring to a cross-section view of FIG. 9B, the interposer 200 may include a first conductive layer 200a, second conductive layer 200b, and an insulating layer 200c formed between the first conductive layer 200a and the second conductive layer 200b. Each of the first conductive via 211 and the second conductive via 212 may penetrate the second conductive layer 200b through the insulating layer 200c from the first conductive layer 200a. Each of the first conductive layer 200a and the second conductive layer 200b may form the conductive plate 208 on each of the first surface 201 and the second surface 202 of the interposer 200. The first conductive via 211 may be electrically insulated from the conductive plate 208 by the opening 215 surrounding the first conductive via 211. The second conductive via 212 may be electrically connected with the conductive plate 208.

Figure 10:
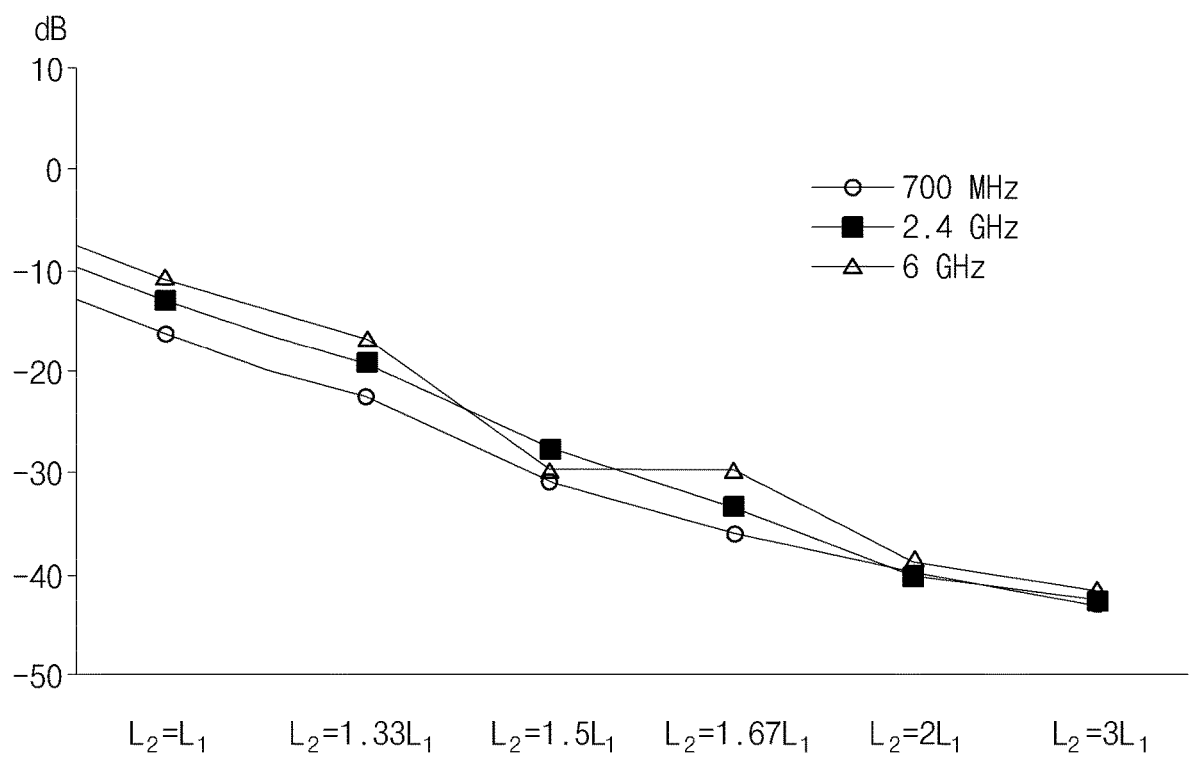
FIG. 10 is a graph illustrating example noise gain according to a width relationship between a non-conductive region and a conductive region illustrated in FIG. 8 and FIGS. 9A and 9B.

FIG. 10 is a graph illustrating example noise gain according to a width relationship between the non-conductive region 206 and the conductive region 205 illustrated in FIG. 8 and FIGS. 9A and 9B.

Referring to FIG. 10, it is understood that a gain of a noise decreases as the length $L_2$ of the conductive region 205 increases. In this case, in the interposer 200 having a uniform height, the length $L_1$ of the non-conductive region 206 and the length $L_2$ of the conductive region 205 may refer, for example, to a length of the non-conductive region 206 in the circumference direction and a length of the conductive region 205 in the circumference direction, and may indicate a width of the non-conductive region 206 and a width of the conductive region 205.

Referring to FIG. 10, there are illustrated noises of various frequencies occurring in the shielding space 203, and a gain of a noise may substantially decrease regardless of a frequency as the length $L_2$ increases. For example, in the case where the width of the conductive region 205 is approximately two times the width of the non-conductive region 206 facing the conductive region 205, it is understood that there is substantially no gain difference between noises of different frequencies. Accordingly, it is advisable that the width of the conductive region 205 is approximately two times the width of the non-conductive region 206.

For example, a high-frequency band of 6 GHz or higher may include an operating frequency of a 5G communication module. As such, the electronic device 100 according to an embodiment may effectively shield a noise radiated from the 5G communication module even though the 5G communication module is disposed in the shielding space 203 formed by the interposer 200. According to various embodiments, the electronic device 100 may include the conductive region 205 wider than the non-conductive region 206, depending on a frequency and/or a gain of a noise occurring in the shielding space 203.

Figure 11:
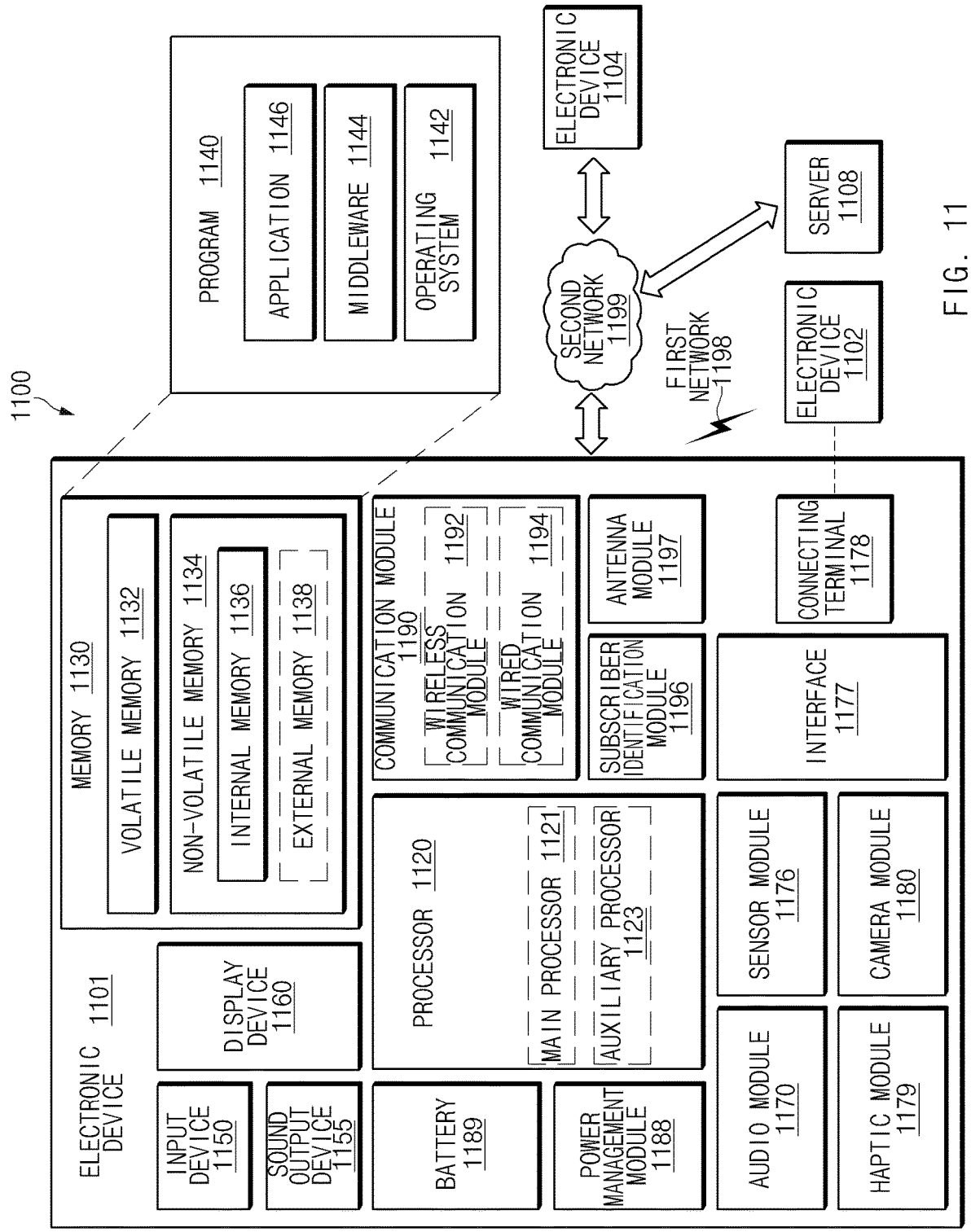
FIG. 11 is a block diagram illustrating an example electronic device in a network environment, according to various embodiments.

FIG. 11 is a block diagram illustrating an example electronic device 1101 in a network environment 1100 according to various embodiments. Referring to FIG. 11, the electronic device 1101 in the network environment 1100 may communicate with an electronic device 1102 via a first network 1198 (e.g., a short-range wireless communication network), or an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input device 1150, a sound output device 1155, a display device 1160, an audio module 1170, a sensor module 1176, an interface 1177, a haptic module 1179, a camera module 1180, a power management module 1188, a battery 1189, a communication module 1190, a subscriber identification module (SIM) 1196, or an antenna module 1197. In some embodiments, at least one (e.g., the display device 1160 or the camera module 1180) of the components may be omitted from the electronic device 1101, or one or more other components may be added in the electronic device 1101. In some embodiments, some of the components may be implemented as single integrated circuitry. For example, the sensor module 1176 (e.g., a fingerprint sensor, an iris sensor, or an illuminance sensor) may be implemented as embedded in the display device 1160 (e.g., a display).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may load a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), and an auxiliary processor 1123 (e.g., a graphics processing unit (GPU), an image signal processor (ISP), a sensor hub processor, or a communication processor (CP)) that is operable independently from, or in conjunction with, the main processor 1121. Additionally or alternatively, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display device 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input device 1150 may receive a command or data to be used by other component (e.g., the processor 1120) of the electronic device 1101, from the outside (e.g., a user) of the electronic device 1101. The input device 1150 may include, for example, a microphone, a mouse, a keyboard, or a digital pen (e.g., a stylus pen).

The sound output device 1155 may output sound signals to the outside of the electronic device 1101. The sound output device 1155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1160 may visually provide information to the outside (e.g., a user) of the electronic device 1101. The display device 1160 may include, for example, a display, a hologram device, or a projector and control circuitry to control a corresponding one of the display, hologram device, and projector. According to an embodiment, the display device 1160 may include touch circuitry adapted to detect a touch, or sensor circuitry (e.g., a pressure sensor) adapted to measure the intensity of force incurred by the touch.

The audio module 1170 may convert a sound into an electrical signal and vice versa. According to an embodiment, the audio module 1170 may obtain the sound via the input device 1150, or output the sound via the sound output device 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™ wireless-fidelity (Wi-Fi) direct, or infrared data association (IrDA)) or the second network 1199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., PCB). According to an embodiment, the antenna module 1197 may include a plurality of antennas. In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 and 1104 may be a device of a same type as, or a different type, from the electronic device 1101.

According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While various example embodiments of the disclosure have been illustrated and described, it will be understood that the various example embodiments are intended to be illustrative, not limiting. Therefore, one of ordinary skill in the art will understand that various changes in form and detail may be made without departing from the true spirit and full scope of the disclosure. The appended claims may, for example, define various embodiments falling within the scope of the disclosure.

What is claimed is:
1. An electronic device comprising:
a housing;
a first printed circuit board (PCB) and a second PCB disposed in the housing; and
an interposer disposed between the first PCB and the second PCB, wherein the interposer includes a first side wall having a first conductive surface and a first non-conductive surface and a second side wall having a second conductive surface and a second non-conductive surface,
wherein the first non-conductive surface faces at least a portion of the second conductive surface,
wherein the second non-conductive surface faces at least a portion of the first conductive surface, and
wherein the interposer includes:
   a first conductive via disposed between the first conductive surface and the second non-conductive surface, the first conductive via electrically connected to at least one of a ground of the first PCB or a ground of the second PCB; and
   a second conductive via disposed between the second conductive surface and the first non-conductive surface, the second conductive via electrically connected to at least one of a ground of the first PCB or a ground of the second PCB.

2. The electronic device of claim 1, further comprising at least one electronic component disposed on at least one of a first surface of the first PCB or a second surface of the second PCB, wherein the first surface of the first PCB and the second surface of the second PCB face each other.

3. The electronic device of claim 2, wherein:
an interior space is defined by the first surface of the first PCB, the second surface of the second PCB, and the first side wall of the interposer; and
the at least one electronic component is disposed in the interior space.

4. The electronic device of claim 1, wherein:
the interposer extends from the first PCB to the second PCB in a first direction;
a length of the first non-conductive surface along a second direction perpendicular to the first direction is shorter than a length of the second conductive surface along the second direction; and
a length of the second non-conductive surface along the second direction is shorter than a length of the first conductive surface along the second direction.

5. The electronic device of claim 1, wherein the interposer includes a first surface disposed on the first PCB and a second surface disposed on the second PCB,
wherein an opening extends from the first surface and the second surface in the interposer, and
wherein a diameter of the opening is larger than at least one of a diameter of the first conductive via or a diameter of the second conductive via.

6. The electronic device of claim 1, wherein the first conductive via is electrically connected to the first conductive surface, and
wherein the second conductive via is electrically connected to the second conductive surface.

7. The electronic device of claim 1, wherein the interposer includes a third conductive via electrically connecting a signal line of the first PCB and a signal line of the second PCB.

8. The electronic device of claim 1, wherein the interposer includes:
   a plurality of first conductive vias, each of the first conductive vias being electrically connected to at least one of the ground of the first PCB or the ground of the second PCB; and
   a plurality of third conductive vias, each of the third conductive vias being electrically connected to one of first signal lines of the first PCB or one of second signal lines of the second PCB,
wherein a first ratio of a number of the first conductive vias to a number of the third conductive vias in a portion of the interposer where the first conductive surface and the second conductive surface face each other is smaller than a second ratio of a number of the first conductive vias to a number of the third conductive vias in a portion of the interposer where the first conductive surface and the second non-conductive surface face each other or where the second conductive surface and the first non-conductive surface face each other.

9. An electronic device, comprising:
a housing;
a first printed circuit board (PCB) disposed in the housing;
a second PCB disposed in the housing; and
an interposer disposed between the first PCB and the second PCB such that the first PCB is spaced apart from the second PCB;
wherein the interposer includes:
   a first portion in which a conductive surface of a first side wall of the interposer is opposed to a conductive surface of a second side wall of the interposer,
   a second portion in which a conductive surface of the second side wall is opposed to a non-conductive surface of the first side wall, and
   a third portion in which a conductive surface of the first side wall is opposed to a non-conductive surface of the second side wall,
wherein the first portion is disposed between the second portion and the third portion, and
wherein the interposer includes a plurality of conductive vias comprising:
   a first conductive via disposed in the second portion, the first conductive via electrically connected to at least one of a ground of the first PCB or a ground of the second PCB; and
   a second conductive via disposed in the third portion, the second conductive via electrically connected to at least one of a ground of the first PCB or a ground of the second PCB.

10. The electronic device of claim 9, wherein the second portion of the interposer includes a plurality of first conductive vias, each of the first conductive vias being electrically connected to at least one of the ground of the first PCB or the ground of the second PCB.

11. The electronic device of claim 9, wherein the second PCB is spaced apart in a first direction from the first PCB, the interposer extends in a second direction perpendicular to the first direction, and the first portion extends longer in the second direction than the second portion or the third portion.

12. The electronic device of claim 9, wherein the interposer includes:
   a plurality of first conductive vias, each of the first conductive vias being electrically connected to at least one of the ground of the first PCB or the ground of the second PCB,
   a plurality of third conductive vias, each of the third conductive vias being electrically connected to a respective one of first signal lines of the first PCB or to a respective one of second signal lines of the second PCB, and
wherein a ratio of a number of the first conductive vias to a number of the third conductive vias in the first portion of the interposer is smaller than a ratio of a number of the first conductive vias to a number of the third conductive vias in the second portion or the third portion of the interposer.

13. The electronic device of claim 12, wherein the number of the first conductive vias in the second portion is greater than the number of the third conductive vias in the second portion, and
   wherein the number of the first conductive vias in the third portion is greater than the number of the third conductive vias in the third portion.

14. The electronic device of claim 12, wherein a ratio is defined as the number of first conductive vias to the sum of the number of first conductive vias and the number of third conductive vias, and
   wherein the defined ratio in the second portion or the third portion is greater than the defined ratio in the first portion.

15. The electronic device of claim 12, wherein the second PCB in spaced apart in a first direction from the first PCB and the first conductive vias and the third conductive vias extend substantially in the first direction.

16. The electronic device of claim 12, wherein the first conductive vias included in the second portion are closer to the first side wall of the second portion than the third conductive vias included in the second portion, and
   wherein the first conductive vias included in the third portion are closer to the second side wall of the third portion than the third conductive vias included in the third portion.

17. The electronic device of claim 12, wherein the first conductive vias included in the second portion are closer to the first side wall of the second portion than the first conductive vias included in the third portion.

18. The electronic device of claim 9, wherein the first conductive via is provided in the second portion for shielding the non-conductive surface of the second portion, and
   wherein the second conductive via is provided in the third portion for shielding the non-conductive surface of the third portion.

19. The electronic device of claim 9, wherein the first and second side walls surround an interior space between the first PCB and the second PCB in which at least one circuit mounted on the first PCB or the second PCB is disposed.

\* \* \* \* \*